(12) United States Patent
Schat

(10) Patent No.: US 11,532,374 B2
(45) Date of Patent: Dec. 20, 2022

(54) MEMORY TESTING

(71) Applicant: NXP B.V., Eindhoven (NL)

(72) Inventor: Jan-Peter Schat, Hamburg (DE)

(73) Assignee: NXP B.V., Eindhoven (NL)

( * ) Notice: Subject to any disclaimer, the term of this patent is extended or adjusted under 35 U.S.C. 154(b) by 68 days.

(21) Appl. No.: 17/315,927

(22) Filed: May 10, 2021

(65) Prior Publication Data

US 2021/0366566 A1 Nov. 25, 2021

(30) Foreign Application Priority Data

May 22, 2020 (EP) .................................... 20176013

(51) Int. Cl.
*G11C 29/42* (2006.01)
*G11C 29/14* (2006.01)
*G11C 29/18* (2006.01)
*G11C 29/44* (2006.01)
*H03K 19/173* (2006.01)

(52) U.S. Cl.
CPC .............. *G11C 29/42* (2013.01); *G11C 29/14* (2013.01); *G11C 29/18* (2013.01); *G11C 29/44* (2013.01); *H03K 19/1737* (2013.01)

(58) Field of Classification Search
CPC ......... G11C 29/42; G11C 29/14; G11C 29/18; G11C 29/44; H03K 19/1737
See application file for complete search history.

(56) References Cited

U.S. PATENT DOCUMENTS

| 7,548,473 | B2 | 6/2009 | Chen et al. |
| 8,451,643 | B2 | 5/2013 | Kim |
| 10,115,477 | B2 | 10/2018 | Tshagharyan et al. |
| 2008/0013380 | A1 | 1/2008 | Cornwell et al. |
| 2010/0122148 | A1 | 5/2010 | Flynn et al. |
| 2012/0317352 | A1 | 12/2012 | Kang et al. |
| 2015/0324250 | A1* | 11/2015 | Wang ................ G06F 11/1402 714/807 |
| 2017/0147433 | A1* | 5/2017 | Shinbashi ............ G11C 29/52 |

(Continued)

OTHER PUBLICATIONS

Elm, C., "Automatic On-line Memory Tests in Workstations", Proceedings of the IEEE International Workshop on Memory Technology, Design and Test, Aug. 8-9, 1994.

(Continued)

*Primary Examiner* — Tuan T Nguyen

(57) ABSTRACT

The disclosure relates to a method and system for memory testing to detect memory errors during operation of a memory module. Example embodiments include a method of detecting an error in a memory module (101), the method comprising the sequential steps of: i) receiving (302) a request from a processor executing an application for a read or write operation at a location of the memory module (101) identified by an address; ii) outputting data (304) from, or writing to, the location of the memory module (101); iii) generating (306) by an error detection module (102) a further read request for the location of the memory module (101) identified by the address; iv) receiving (307) at the error detection module (102) an error correction code from the memory module (101) for the location identified by the address; and vi) providing (311) by the error detection module (102) an alert output for the address if the error correction code indicates an error.

18 Claims, 3 Drawing Sheets

(56) References Cited

U.S. PATENT DOCUMENTS

| | | | | |
|---|---|---|---|---|
| 2018/0130546 A1* | 5/2018 | Tshagharyan | .......... | G11C 29/38 |
| 2022/0108762 A1* | 4/2022 | Jang | ....................... | G11C 29/42 |
| 2022/0277800 A1* | 9/2022 | Zeli | ................... | G11C 29/4401 |

OTHER PUBLICATIONS

Harutyunyan, G., "Impact of Process Variations on Read Failures in SRAMs", East-West Design & Test Symposium, Sep. 27-30, 2013.

Rahman, M., "COMeT: Continuous Online Memory Test", 117th IEEE Pacific Rim International Symposium on Dependable Computing, Dec. 12-14, 2011.

Rahman, M., "COMeT+: Continuous Online Memory Testing with Multi-Threading Extension", IEEE Transactions on Computers, vol. 63, No. 7, Jul. 2014.

Seyedzadeh, M., "Leveraging ECC to Mitigate Real Disturbance, False Reads and Write Faults in STT-RAM", 46th Annual IEEE/IFIP International Conference on Dependable Systems and Networks, Oct. 3, 2016.

Singh, M., "Software Based In-System Memory Test For Highly Available Systems", 2005 IEEE International Workshop on Memory Technology, Design, and Testing, Jul. 6-8, 2005.

Tshagharyan, G., "Modeling and Testing of Aging Faults in FinFET Memories for Automotive Applications", 2018 IEEE International Test Conference, Oct. 29-Nov. 1, 2018.

\* cited by examiner

MEMORY TESTING

CROSS—REFERENCE TO RELATED APPLICATIONS

This application claims the priority under 35 U.S.C. § 119 of European Patent application no. 20176013.9, filed on 22 May 2020, the contents of which are incorporated by reference herein.

FIELD

The disclosure relates to a method and system for memory testing to detect memory errors during operation of a memory module.

BACKGROUND

New integrated circuit fabrication technologies may involve or lead to new failure mechanisms. Some failure mechanisms may take several years of mass production to be identified and described before appropriate tests can be developed and deployed. This is particularly relevant for new processes that involve down-scaling feature sizes and for new topologies such as FinFETs. New failure mechanisms may be especially noticeable in memories, which tend to be more affected by failures due to the use of minimal-size transistors. In respect of FinFET RAMs, one possible failure mechanism is known as dynamic Deceptive Read Destructive Fault (dDRDF). This failure mechanism involves charge being successively added (or removed) to a memory cell's internal node, leading to a read failure after several consecutive read accesses. This fault may be detectable during production testing but may also appear after aging of a memory during use. Standard methods to detect and handle errors during use, such as ECC (Error Check and Correction) and MBIST (Memory Built-In Self-Test), may be insufficient to handle such faults. ECC may be unable to correct errors because several bits of a word may fail after aging. MBIST at power-up may also be insufficient because errors may only appear after some self-heating during operation.

The above mentioned dDRDF mechanism is considered to be the dominant failure mechanism due to aging of initially defect-free FinFET RAMs. This is understood to be caused by Bias Temperature Instability (BTI), in which a shift of a transistor's threshold voltage occurs due to charge carriers migrating into the transistor's gate oxide layer. Other failure modes, however, may also be present.

To fulfil functional safety requirements for reliability, standard ECC and self-testing at regular intervals are usually considered sufficient. This may not, however, be the case for new failure mechanisms such as dDRDF because standard testing may not provide a sufficiently early warning for an increasing failure rate. This may lead to unexpected failures during operation, which can be especially problematic in critical systems such as in automotive safety-critical systems. Obtaining a warning in advance of such a failure would therefore be advantageous, particularly if doing so can be achieved while being transparent and without disturbing operation.

SUMMARY

According to a first aspect there is provided a method of detecting an error in a memory module, the method comprising the sequential steps of:

i) receiving a request from a processor executing an application for a read or write operation at a location of the memory module identified by an address;
ii) outputting data from, or writing to, the location of the memory module;
iii) generating by an error detection module a further read request for the location of the memory module identified by the address;
iv) receiving by the error detection module an error correction code from the memory module for the location identified by the address; and
vi) providing by the error detection module an alert output for the address if the error correction code indicates an error.

Steps iii) and iv) may be repeated by the error detection module until either a new request for a read or write operation is received or until steps iii) and iv) have been carried out N times, where N is an integer greater than 1.

Repeating the process of generating further read requests and receiving error correction codes enables the method to detect particular types of faults that may occur in memory cells, particularly those in FinFet RAM.

The number of repeats, N, may be 2, 3, 4, 5, 6 or more. In practical implementations, an upper limit for N may be 15.

The alert output may be provided by the error detection module during or after steps iii) and iv) have been performed N times.

During steps iii) and iv), the error detection module may provide a control signal to first and second multiplexers to enable the address and further read request to be provided to the memory module. The control signal may be disabled by the error detection module if a new request for a read or write operation is received, thereby enabling an application to access the memory module without delay.

According to a second aspect there is provided a memory system comprising:

a memory module configured to:
  receive a request from a processor executing an application for a read or write operation at a location of the memory module identified by an address; and
  output data from, or write to, the location of the memory module;
an error detection module configured to:
  i) generate a further read request for the location of the memory module identified by the address;
  ii) receive an error correction code from the memory module for the location identified by the address; and
  iii) provide an alert output for the address if the error correction code indicates an error.

The error detection module may be configured to perform steps i) and ii) after the memory module receives the request for a read or write operation and if a new read or write request is not received by the memory module.

The error detection module may be configured to perform steps i) and ii) N times, where N is an integer greater than 1. N may be 2, 3, 4, 5, 6 or more, and may be no more than 15.

The memory system may comprise:
  a first multiplexer configured to receive a first address input for an application to address the memory module and a second address input from the error detection module;
  a second multiplexer configured to receive a first read enable input for the application and a second read enable input from the error detection module, wherein the error detection module is configured to provide a control signal to the first and second multiplexers to enable the address and further read request to be provided to the memory module if a new read or write request is not received by the memory module.

The memory module may be a RAM, for example SRAM or DRAM, comprising FinFETs, for example having minimum feature sizes of around 28 nm, 22 nm, 16 nm or smaller.

The memory system may be implemented as an integrated circuit comprising the memory module and error detection module.

According to a third aspect there is provided a computer program comprising instructions to cause a computer processor to perform the method according to the first aspect.

There may be provided a computer program, which when run on a computer, causes the computer to configure any apparatus, including a circuit, controller, sensor, filter, or device disclosed herein or perform any method disclosed herein. The computer program may be a software implementation, and the computer may be considered as any appropriate hardware, including a digital signal processor, a microcontroller, and an implementation in read only memory (ROM), erasable programmable read only memory (EPROM) or electronically erasable programmable read only memory (EEPROM), as non-limiting examples. The software implementation may be an assembly program.

The computer program may be provided on a non-transitory computer readable medium, which may be a physical computer readable medium, such as a disc or a memory device, or may be embodied as a transient signal. Such a transient signal may be a network download, including an internet download.

These and other aspects of the invention will be apparent from, and elucidated with reference to, the embodiments described hereinafter.

BRIEF DESCRIPTION OF DRAWINGS

Embodiments will be described, by way of example only, with reference to the drawings, in which.

Figure 1:
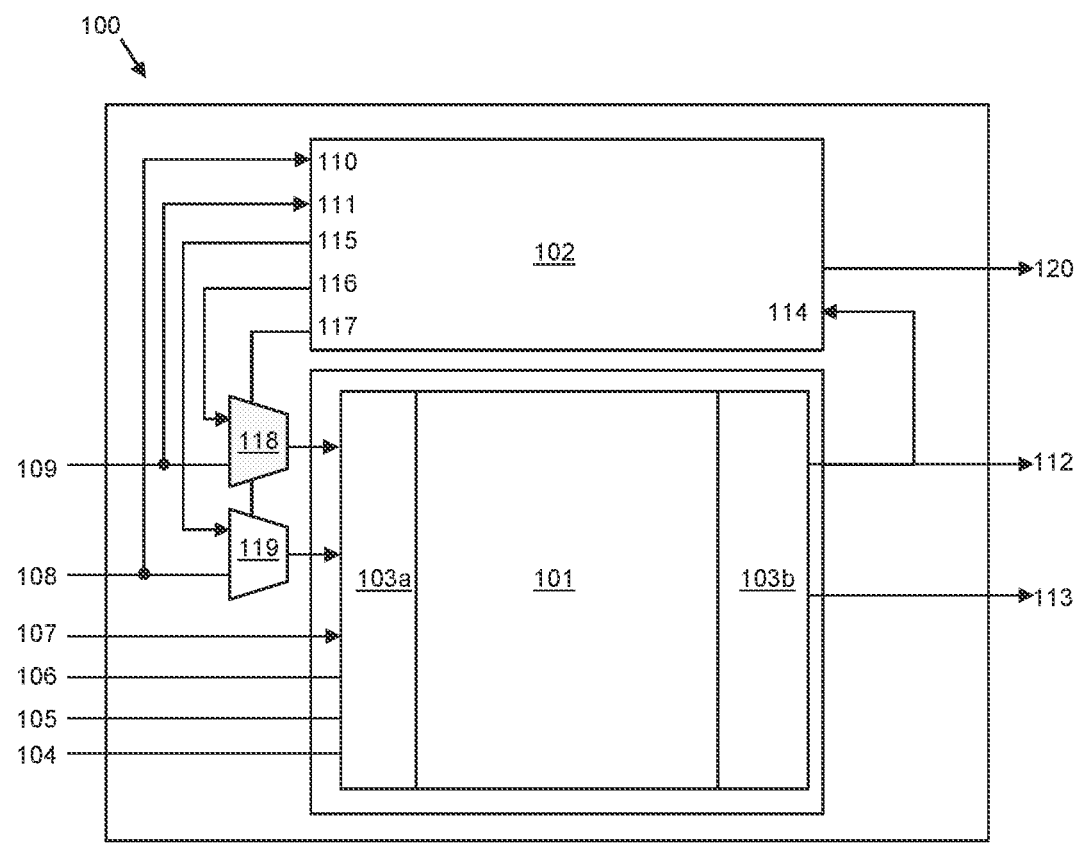
FIG. 1 is a schematic block diagram of an example memory system.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar feature in modified and different embodiments.

DETAILED DESCRIPTION OF EMBODIMENTS

Testing for bit cell faults during operation of a memory system can be done by reading data words from a location identified by a RAM address and observing the error correction code (ECC) result, which indicates whether there is no error, a correctable error or an uncorrectable error. In the case of a correctable error, the corrected data word can be written into the RAM. Unlike other memory self-test methods that may be performed during operation, ECC checks do not slow down or interrupt operation of an application while the application is using the memory. The application may be a computer program being executed by a processor requiring access to the memory during execution.

Besides defects following known physical models, such as BTI (as mentioned above), hot carrier injection (HCI) or electromigration, other unmodelled faults may also arise. A method of self-testing memory during operation, i.e. in the field, that can uncover a range of defects is therefore desirable.

FIG. 1 illustrates an example memory system 100, which may form part or all of an integrated circuit, comprising a memory module 101 and an error detection module 102. The memory module 101 comprises error correction code logic 103a, 103b on the input and output interfaces of the memory module 101. On the input side, the memory module 101 receives inputs from a clock signal 104, a chip select input 105, a write enable input 106, a data input 107, a read enable input 108 and an address input 109. The read enable and address inputs 108, 109 are also provided as inputs 110, 111 to the error detection module 102. The memory module 101 provides outputs via the ECC logic 103b in the form of an ECC error output 112 and data output 113. The output ECC logic 103b is also provided as an ECC error input 114 to the error detection module 102.

The error detection module 102 provides a read enable output 115, an address output 116 and a control output 117. The control output 117 is provided to first and second multiplexers 118, 119 to control address and read enable inputs respectively to the memory module 101 via the input ECC logic 103a. The error detection module 102 may thereby take control of read requests to the memory module 101 and define the address to which a read request is made.

An alert output 120 from the error detection module 102 provides an alert signal in the event an error is detected after an error check has been performed on the memory module 101.

Figure 2:
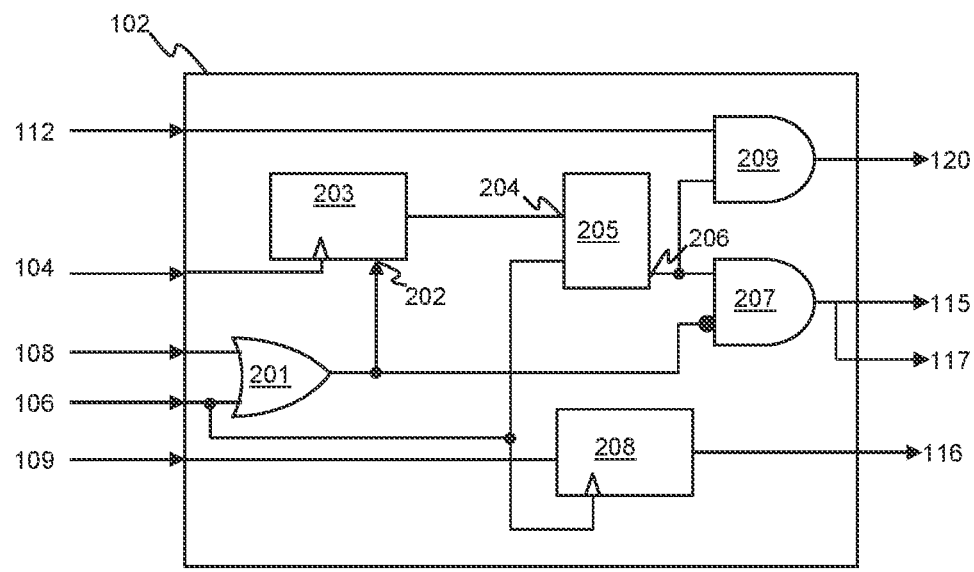
FIG. 2 is a schematic diagram illustrating an example sequence of operations.

FIG. 2 illustrates in further detail an example logic model of the error detection module 102. The error detection module 102 receives inputs from the ECC error output 112, clock signal 104, read enable input 108, write enable input 106 and address input 109. The error detection module 102 provides outputs in the form of the alert output 120, read enable output 115, address output 116 and control output 117.

The read and write enable inputs 106, 108 are connected to an OR gate 201, which provides a logic output to a reset input 202 of a counter 203. The counter 203 receives the clock signal 104 and begins a count at zero when reset, incrementing upon subsequent clock cycles. When the counter 203 reaches a predetermined count a reset signal is provided to a reset input 204 of an R/S flip-flop 205. The R/S flip-flop 205 provides an output signal 206 indicating a state of the error detection module 102. An output of 0 indicates the module 102 is inactive and not performing read requests, while an output of 1 indicates that the module 102 is performing ("dummy") read requests. The counter 203 counts the number of dummy read requests made to the memory module 101 and stops the read requests being made by resetting the flip-flop 205 after a predefined number.

As described herein, a logical false value is defined as a 0, while a logical true value is defined as a 1. These values may correspond to low and high voltages respectively. In alternative arrangements the reverse may be used, i.e. where a logical false is represented by a high voltage and a logical true is represented by a low voltage. The OR gate 201 provides a positive (or true) output if either an application read access or an application write access occurs. In both cases the counter 203 is asynchronously reset and the output signal 206 set to 0 such that the module 102 immediately gives control back to the application requesting access to the memory module 101.

A first AND gate 207 receives an inverted input from the output of the OR gate 201 and the output signal 206 from the flip-flop 205, and outputs the read enable and control output signals 115, 117. In other words, if (a read OR write request is NOT being made) AND the status of the module 102 is active, the read enable and control signals 115, 117 are active, allowing the module 102 to access the memory module 101.

An address latch 208 stores the address of the first application read access, which the module 102 then uses in subsequent read access requests to the memory module. A logic 1 at the output 206 of the R/S flip-flop 205 indicates that the dummy read mode is active. In this state, a possible ECC error signal 112 may propagate to the alert output 120 and the multiplexers 118, 119 (FIG. 1) are set by the control output 117 to receive the address and read enable signals for the dummy read mode from the address output 116 and read enable output 115 respectively of the error detection module 102.

A second AND gate 209 gates the ECC error signal 112 so that the alert signal 120 is provided only if the state of the module 102 is active and the current received error signal 112 is high. The alert signal 120 is provided to further logic (not shown) that acts upon the alert signal 120, for example to maintain a log of addresses showing errors and/or to provide an indication that the memory system 100 should be replaced when possible due to failure being imminent.

Figure 3:
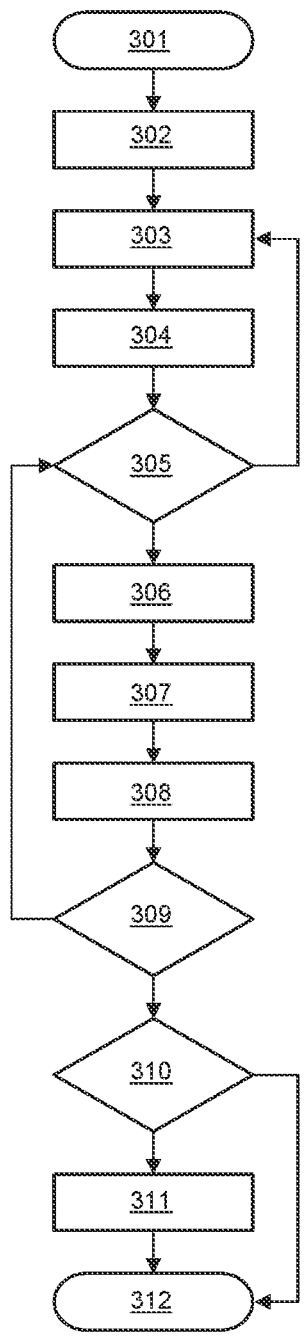
FIG. 3 is a flow diagram illustrating an example method of operating an example memory system.

FIG. 3 illustrates a sequence of steps illustrating operation of the error detection module 102. The process starts 301 with a read or write request being made 302 by an application requesting access to the memory module 101. This triggers the counter 203 being reset to zero at step 303. Data is provided from or written to the memory module at step 304. If, at step 305, a further read/write request is not being made, at step 306 a dummy read request is made by the error detection module 102. An ECC error output 112 is then provided at step 307 and the counter 203 is incremented at step 308. If, at step 309, the counter has reached a predefined limit and the ECC error output 112 is high (step 310), an alert output 120 is provided at step 311 and the process ends at step 312. If, at step 310, the ECC error output 112 is not high, the process ends without providing an alert output 120. If, at step 309, the counter 203 has not reached the predefined limit, the process of requesting a further dummy read request is repeated unless a read or write request has been made by the application requesting access to the memory module 101, in which case the counter resets (step 303) and data is provided from or written to the memory module at step 304.

The error detection process described above will only proceed to completion if there is no further read or write request made while the error detection process is in progress. An application requesting access to the memory module 101 is therefore not held up by the error detection process.

The number, N, of dummy read cycles, i.e. the predefined limit for the counter 203, may be one or more. In some examples N may be two, three, four, five, six or more, given that dDRDF has been known to occur after several consecutive read requests. In practical implementations, N may be as high as around 15.

Figure 4:
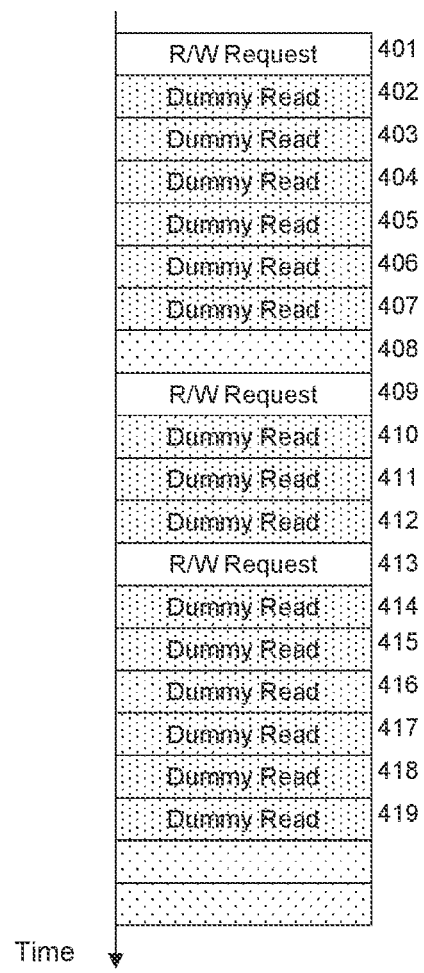
FIG. 4 is a schematic diagram illustrating an example series of operations accessing a memory module.

FIG. 4 illustrates schematically an example series of operations involving the memory system described herein. A first read or write request 401 is made by the application for an address identifying a location in the memory module 101. This is followed by six consecutive dummy read requests 402-407 while no further application read or write requests are made. In each dummy read request 402-407 the output data from the memory module is compared with the output data from the first read request 401. After some idle time 408, a second application read or write request 409 is made for another address. The error detection module then begins making dummy read requests for this address but is stopped after three dummy requests 410-412 by a third application read or write request 413, which then triggers another series of dummy read requests 414-419. This series of dummy read requests 413-418 completes and provides an alert output if an error is detected.

Figure 5:
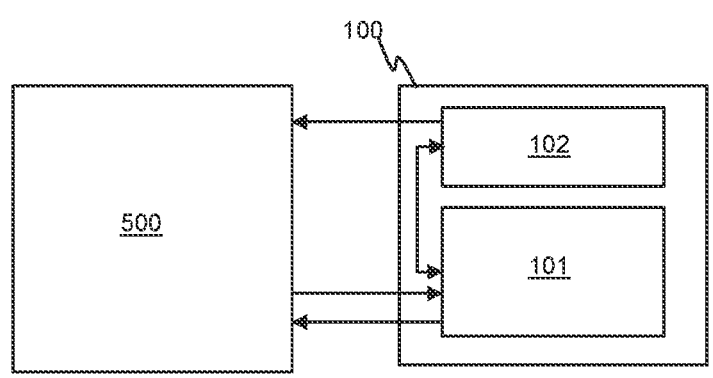
FIG. 5 is a schematic diagram illustrating a processor connected to an example memory system.

FIG. 5 illustrates an example processor 500 connected to a memory system 100 of the type described herein. The processor 500 may execute an application that requires access to the memory module 101, providing read and write requests to the memory module 101. Read requests are responded to by providing data output from the memory module 101 to the processor 500 and write requests are responded to by writing data from the processor into memory cells identified by addresses provided to the memory module 101. During execution of the application by the processor 500, the error detection module 102 provides further dummy read requests after each read or write request made by the application being executed on the processor 500. Any alert output resulting from an error output during such dummy read requests may be provided to the processor 500 for further action. The processor 500 and memory system 100 may be provided on separate integrated circuits connected by a communication bus.

The error detection module 102 and method of error detection as described herein enables detection of memory defects according to particular failure modes involving repeated read requests and enables checks for such defects to be carried out concurrently with an application that requires access to the memory. An advantage is that an early warning can be provided of impending memory failure, depending on the number of consecutive read requests made. An error arising after six repeated read requests, for example, may indicate an expected memory failure within a period of years, although this can depend on other factors such as a temperature of the memory during operation. The error detection module and method may be particularly applicable to memory modules comprising FinFETs, for example with minimum feature sizes of around 16 nm or smaller.

From reading the present disclosure, other variations and modifications will be apparent to the skilled person. Such variations and modifications may involve equivalent and other features which are already known in the art of memory systems, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub-combination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. A method of detecting an error in a memory module, the method comprising the sequential steps of:
   i) receiving a request from a processor executing an application for a read or write operation at a location of the memory module identified by an address;
   ii) outputting data from, or writing to, the location of the memory module;
   iii) generating by an error detection module a further read request for the location of the memory module identified by the address;
   iv) receiving at the error detection module an error correction code from the memory module for the location identified by the address; and
   vi) providing by the error detection module an alert output for the address if the error correction code indicates an error.

2. The method of claim 1, wherein the error detection module repeats steps iii) and iv) until either a new request for a read or write operation is received or until steps iii) and iv) have been carried out N times, where N is an integer greater than 1.

3. The method of claim 2, wherein N is 2, 3, 4, 5, 6 or more.

4. The method of claim 2, wherein N is no more than 15.

5. The method of claim 2, wherein the alert output is provided by the error detection module during or after steps iii) and iv) have been performed N times.

6. The method of claim 1 wherein, during steps iii) and iv), the error detection module provides a control signal to first and second multiplexers to enable the address and further read request to be provided to the memory module.

7. The method of claim 6 wherein the error detection module disables the control signal if a new request for a read or write operation is received.

8. A memory system comprising:
   a memory module configured to:
   receive a request from a processor executing an application for a read or write operation at a location of the memory module identified by an address; and
   output data from, or write to, the location of the memory module;
   an error detection module configured to:
   i) generate a further read request for the location of the memory module identified by the address;
   ii) receive an error correction code from the memory module for the location identified by the address; and
   iii) provide an alert output for the address if the error correction code indicates an error.

9. The memory system of claim 8, wherein the error detection module is configured to perform steps i) and ii) after the memory module receives the request for a read or write operation and if a new read or write request is not received by the memory module.

10. The memory system of claim 8, wherein the error detection module is configured to perform steps i) and ii) N times, where N is an integer greater than 1.

11. The memory system of claim 10, wherein N is 2, 3, 4, 5, 6 or more.

12. The memory system of claim 11, wherein N is no more than 15.

13. The memory system of claim 8 comprising:
   a first multiplexer configured to receive a first address input for an application to address the memory module and a second address input from the error detection module;
   a second multiplexer configured to receive a first read enable input for the application and a second read enable input from the error detection module,
   wherein the error detection module is configured to provide a control signal to the first and second multiplexers to enable the address and further read request to be provided to the memory module if a new read or write request is not received by the memory module.

14. The memory system of claim 8 wherein the memory module is a RAM comprising FinFETs.

15. The memory system of claim 9, wherein the error detection module is configured to perform steps i) and ii) N times, where N is an integer greater than 1.

16. The memory system of claim 9 comprising:
   a first multiplexer configured to receive a first address input for an application to address the memory module and a second address input from the error detection module;
   a second multiplexer configured to receive a first read enable input for the application and a second read enable input from the error detection module,
   wherein the error detection module is configured to provide a control signal to the first and second multiplexers to enable the address and further read request to be provided to the memory module if a new read or write request is not received by the memory module.

17. The memory system of claim 10 comprising:
   a first multiplexer configured to receive a first address input for an application to address the memory module and a second address input from the error detection module;
   a second multiplexer configured to receive a first read enable input for the application and a second read enable input from the error detection module,
   wherein the error detection module is configured to provide a control signal to the first and second multiplexers to enable the address and further read request to be provided to the memory module if a new read or write request is not received by the memory module.

18. A computer program comprising instructions to cause a computer memory system to perform at least the following:
   i) receiving a request from a processor executing an application for a read or write operation at a location of the memory module identified by an address;
   ii) outputting data from, or writing to, the location of the memory module;
   iii) generating by an error detection module a further read request for the location of the memory module identified by the address;
   iv) receiving at the error detection module an error correction code from the memory module for the location identified by the address; and vi) providing by the error detection module an alert output for the address if the error correction code indicates an error.

\* \* \* \* \*